US007177068B2

(12) United States Patent
Niendorf et al.

(10) Patent No.: US 7,177,068 B2
(45) Date of Patent: Feb. 13, 2007

(54) APPARATUS, METHOD AND SYSTEM FOR PROVIDING ENHANCED MECHANICAL PROTECTION FOR THIN BEAMS

(75) Inventors: Andreas Niendorf, Berlin (DE); Wilhelm Frey, Mountain View, CA (US); Zhiyu Pan, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 68 days.

(21) Appl. No.: 10/327,532

(22) Filed: Dec. 20, 2002

(65) Prior Publication Data

US 2004/0120057 A1 Jun. 24, 2004

(51) Int. Cl.
*G02B 26/08* (2006.01)
(52) U.S. Cl. .................. 359/298; 359/224; 257/415
(58) Field of Classification Search ................ 359/224, 359/290, 291, 298, 872; 310/309; 257/415
See application file for complete search history.

(56) References Cited

U.S. PATENT DOCUMENTS 5,375,033 A * 12/1994 MacDonald ................ 361/281

| 5,543,956 | A | | 8/1996 | Nakagawa |
| 5,914,553 | A | * | 6/1999 | Adams et al. ............... 310/309 |
| 6,307,298 | B1 | * | 10/2001 | O'Brien ....................... 310/309 |
| 6,428,489 | B1 | | 8/2002 | Jacobsen |
| 6,632,698 | B2 | * | 10/2003 | Ives ............................ 438/52 |
| 6,701,038 | B2 | * | 3/2004 | Rensing et al. ............... 385/18 |
| 6,782,153 | B2 | * | 8/2004 | Polinsky et al. ............. 385/16 |
| 6,798,113 | B2 | * | 9/2004 | Ives ........................... 310/309 |
| 6,812,617 | B2 | * | 11/2004 | Ives ........................... 310/309 |
| 6,863,832 | B1 | | 3/2005 | Wiemer |
| 6,921,952 | B2 | * | 7/2005 | Jeong ......................... 257/417 |
| 2002/0164113 | A1 | | 11/2002 | Rensing |

FOREIGN PATENT DOCUMENTS

| DE | 198 51 667 | 5/2000 |
| DE | 199 41 045 | 4/2001 |
| DE | 199 63 382 | 7/2001 |
| EP | 1 234 799 A | 8/2002 |
| WO | WO 01/07869 A1 | 2/2001 |

* cited by examiner

*Primary Examiner*—Mark A. Robinson
(74) *Attorney, Agent, or Firm*—Kenyon & Kenyon LLP

(57) ABSTRACT

An arrangement for a micro-mechanical beam includes a support structure to provide an increase in bending stiffness of the micro-mechanical beam without significantly influencing torsional stiffness, where the support structure is configured to directly attach to the micro-mechanical beam.

16 Claims, 10 Drawing Sheets

APPARATUS, METHOD AND SYSTEM FOR PROVIDING ENHANCED MECHANICAL PROTECTION FOR THIN BEAMS

FIELD OF THE INVENTION

The present invention relates to an improved micro-mechanical beam or spring configuration for using micro-mechanical applications, micro-mechanical mirrors.

BACKGROUND OF THE INVENTION

German Published Patent Application No. 198 51 667 refers to a basic configuration of a micro-mechanical mirror arrangement, in which a micro-mechanical mirror plate is suspended by one or more torsional beams or beam springs. To allow large deflection angles of the mirror plate, the torsional beams may be required to be thin and long which may be prone to break.

German Published Patent Application No. 199 63 382 and German Published Patent Application No. 199 41 045 refer to a modification which may provide a more robust configuration of the micro-mechanical mirror arrangement. The modification may relieve stress upon the micro-mechanical torsional beams if the micro-mechanical mirror plate is moved in a direction that is vertical to the plane of the micro-mechanical mirror plate, but not if the micro-mechanical mirror plate is moved in a direction that is parallel or "in-plane" with the micro-mechanical mirror plate. To increase the robustness further, the thickness of the micro-mechanical beams may be increased and/or their length may be reduced. However, such changes to the length and thickness may decrease the "freedom of movement" of the micro-mechanical beam.

German Published Patent Application No. 199 63 382 and German Published Patent Application No. 199 41 045 refer to a two parallel beam configuration, as well as the transformation of bending in a vertical direction perpendicular to the surface of the substrate (i.e. the Z-direction) in tension by using a transversal beam. The resulting stiffness of the whole structure may therefore be significantly higher than that for a single spring of the basic configuration.

SUMMARY OF THE INVENTION

It is believed that an exemplary embodiment of the present invention may provide enhanced protection for micro-mechanical torsional beam springs via the addition of one or more support structures that may attach directly to the micro-mechanical beam. The attachable structures may assist in limiting the "freedom of movement" of the micro-mechanical beam in a more precise manner by preventing undesirable bending actions of the micro-mechanical beam at specific points along the beam. Such targeting or "pinpointing" may increase the bending stiffness of the beam at the specific points with only a marginal influence to its torsional stiffness. Thus, the protective support structures may increase the robustness of the micro-mechanical beam and may permit their use under harsh and/or tough environmental conditions. The structures may also facilitate the production of moveable structures (such as, for example, mirrors with much higher robustness) as well as making mass application and/or higher yields feasible.

The attachable structures may be applied in devices such as bar-code readers, leveling devices, scanners, display technology devices, and in particular, micro-mechanical mirrors. For example, the attachable support structures may provide an effective way to reduce the freedom of the in-plane movement of a micro-mechanical mirror that is suspended by one or more micro-mechanical beams. The attachable support structures may also provide enhanced protection for devices in a mobile configuration, such as, for example, an automotive application, where movement-induced vibration may be a major concern.

An exemplary embodiment of the present invention is directed to providing an arrangement for use with a micro-mechanical beam, having a support structure configured to directly attach to the micro-mechanical beam to increase bending stiffness of the micro-mechanical beam without significantly influencing torsional stiffness.

Another exemplary embodiment is directed to an arrangement in which the support structure is positioned at a point of a maximum bending of the micro-mechanical beam.

Yet another exemplary embodiment is directed to an arrangement in which the support structure is constructed to reduce stiction.

Still another exemplary embodiment is directed to an arrangement in which the support structure includes a rounded contact area.

Yet another exemplary embodiment is directed to an arrangement in which the support structure includes a tapered end near a point of attachment with the micro-mechanical beam.

Still another exemplary embodiment is directed to an arrangement in which the support structure is arranged at a point of maximum bending of the micro-mechanical beam and includes a rounded contact area and a tapered end near a point of attachment.

Yet another exemplary embodiment is directed to an arrangement in which a shape of the support structure includes at least one of round, cubic, cylindrical, tubular, coil-shaped, quonset-shaped, prism-shaped, pyramid, obelisk, wedge, spherical, prolate spheroid, cone-shaped, catenoid, ellipsoid, paraboloid, conoid, disc-shaped, toroid, serpentine, helix, concave, and convex.

Still another exemplary embodiment is directed to an arrangement having at one additional support structure.

Yet another exemplary embodiment is directed to an arrangement in which the support structure and the at least one additional support structure are equal in at least one of length, size, and shape.

Still another exemplary embodiment is directed to an arrangement in which the support structure and the at least one additional support structure are unequal in at least one of length, size, and shape.

Yet another exemplary embodiment is directed to a device for use with a micro-mechanical beam having a protective structure to restrict a bending action of the micro-mechanical beam, and configured to directly attach to the micro-mechanical beam at specific points along the beam.

Still another exemplary embodiment is directed to a device in which the protective structure includes at least two adjacent support structures arranged to touch each upon reaching a predetermined bending action of the micro-mechanical beam and prevent a further bending action of the micro-mechanical beam.

Yet another exemplary embodiment is directed to a device in which the at least two adjacent support structures are positioned at points of most severe deflection of the micro-mechanical beam.

Still another exemplary embodiment is directed to a device in which the protective structures are distributed uniformly with an even length along an axis of the micro-mechanical beam.

Yet another exemplary embodiment is directed to an device in which the protective structures are distributed non-uniformly along an axis of the micro-mechanical beam.

Still another exemplary embodiment is directed to a device in which the protective structures are distributed with a decreasing length along the axis of the micro-mechanical beam.

Yet another exemplary embodiment is directed to a device in which the protective structures are distributed with an increasing length along the axis of the micro-mechanical beam.

Still another exemplary embodiment is directed to a device in which the protective structure restricts the bending action in at least one of a variety of directions and all directions.

Yet another exemplary embodiment is directed to an arrangement for use with a micro-mechanical mirror having a micro-mechanical beam attached to the micro-mechanical mirror and a support structure attached to the micro-mechanical beam to restrict a bending action of the micro-mechanical beam.

Still another exemplary embodiment is directed to an arrangement having a micro-mechanical mirror plate, a micro-mechanical beam attached to the micro-mechanical mirror plate, and a support structure to restrict a bending action of the micro-mechanical mirror beam.

Yet another exemplary embodiment is directed to an arrangement to protect a micro-mechanical mirror plate having a support structure configured to restrict an in-plane movement of the micro-mechanical mirror plate, and being directly attachable to a micro-mechanical beam that suspends the micro-mechanical mirror plate.

DETAILED DESCRIPTION

Figure 1A:
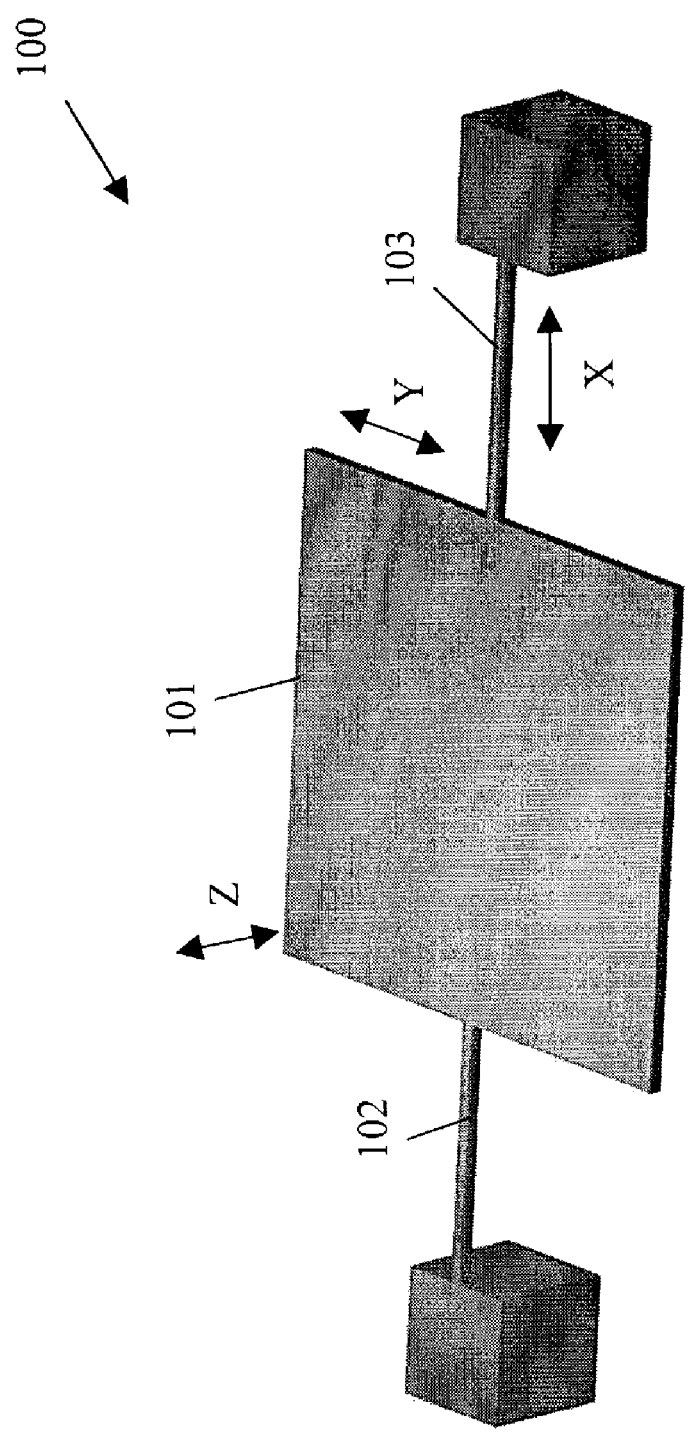
FIG. 1a shows a micro-mechanical mirror arrangement.

FIG. 1a shows a configuration of a micro-mechanical mirror arrangement 100. The micro-mechanical arrangement 100 includes a micro-mechanical mirror plate 101 suspended by two torsional micro-mechanical beams 102 and 103. The micro-mechanical beams 102, 103 permit a certain "freedom of movement" of the micro-mechanical mirror plate 101. In particular, the tension of the micro-mechanical beams 102, 103 restricts a movement of the micro-mechanical mirror plate 101 in a direction X along the axis of the micro-mechanical beams 102, 103, and at the same time permits movement in a direction Y that is in-plane with the micro-mechanical mirror plate 101 (that is, perpendicular to the axis of the micro-mechanical beams 102, 103 and a direction Z that is vertical to the plane of the micro-mechanical mirror plate 101).

To increase the freedom of movement of the micro-mechanical mirror plate 101, the micro-mechanical beams 102, 103 may be extended lengthwise in the direction X along the axis of the micro-mechanical beams 102, 103 and/or their thickness may be reduced. However, the extended length or reduced thickness of the micro-mechanical beams 102, 103 may make them prone to breakage or may not adequately restrict a particular undesired movement of the micro-mechanical mirror plate 101.

To make the micro-mechanical beams 102, 103 more robust and/or to restrict a particular undesired movement of the micro-mechanical mirror plate 101, the micro-mechanical beams 102, 103 may be shortened lengthwise and/or their thickness may be increased. However, such shortening and/or thickening of the micro-mechanical beams 102, 103 may restrict the overall freedom of movement of the micro-mechanical mirror plate 101. Furthermore, such shortening and/or thickening may also pose significant challenges to their production.

Figure 1B:
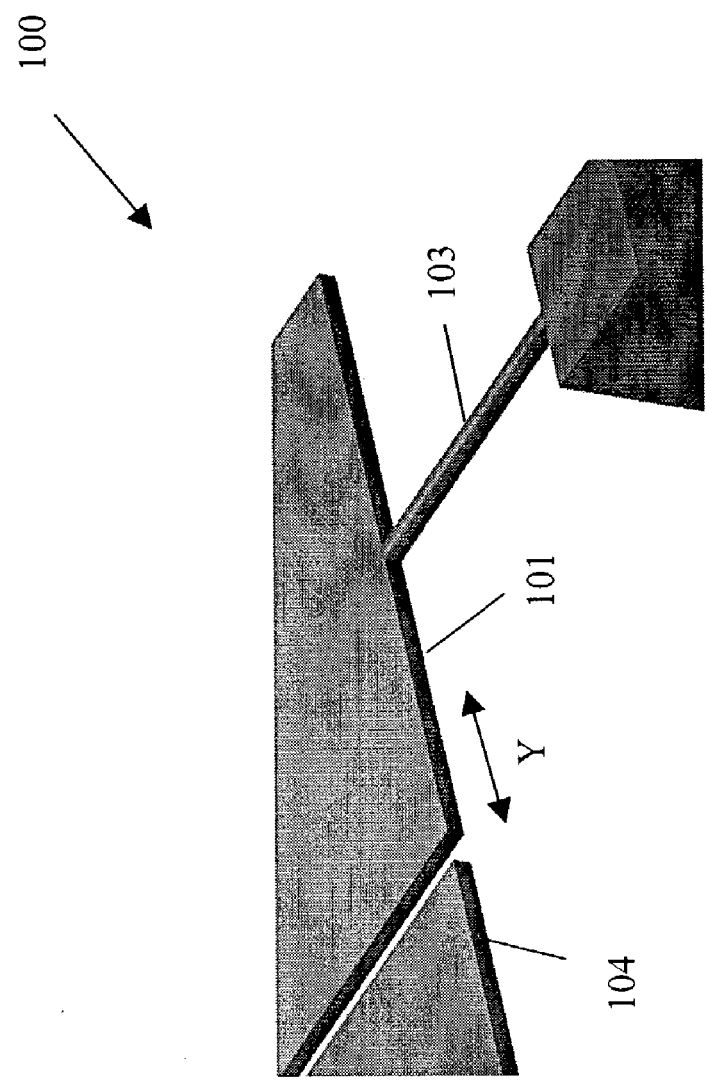
FIG. 1b shows a partial view of the micro-mechanical mirror arrangement of FIG. 1a with the addition of a micro-mechanical mirror stop to limit the in-plane movement of the micro-mechanical mirror plate.

FIG. 1b shows a partial view of the micro-mechanical mirror arrangement 100 of FIG. 1a with the addition of a micro-mechanical mirror stop 104 to limit the in-plane movement of the micro-mechanical mirror plate 101. The micro-mechanical mirror stop 104 may be made out of, for example, the same material or film as the micro-mechanical mirror plate 101. However, in case of an applied shock to the micro-mechanical mirror arrangement 100, the micro-mechanical mirror stop 104 may not prevent the micro-mechanical mirror plate 101 from tilting downwards and "diving" beneath the micro-mechanical mirror stop 104.

Figure 1C:
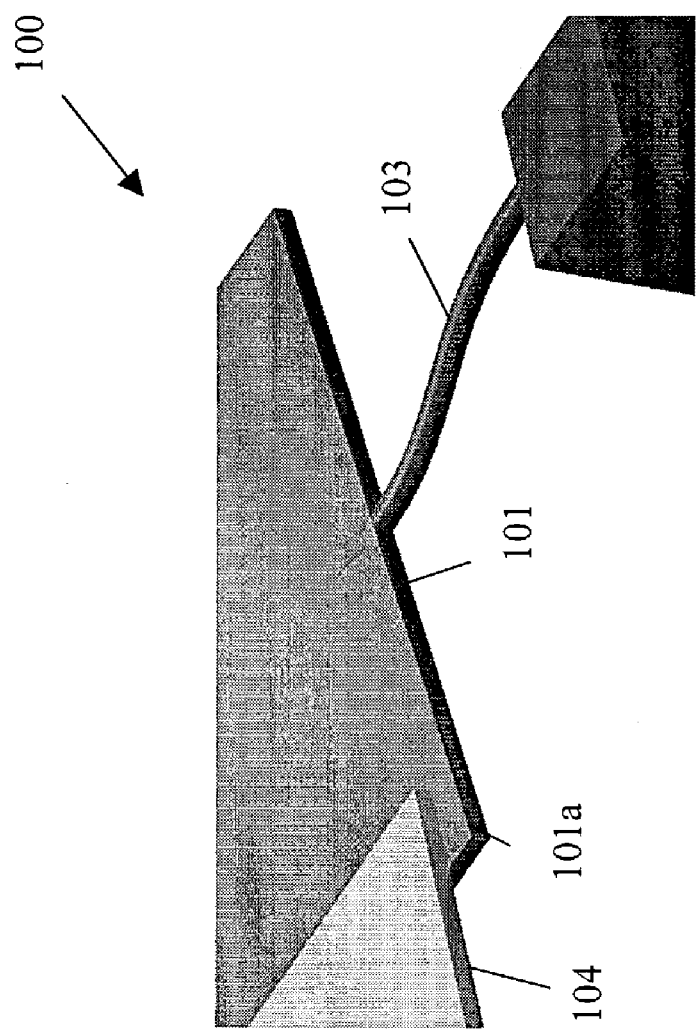
FIG. 1c shows a partial view of micro-mechanical mirror arrangement and the additional micro-mechanical mirror stop of FIG. 1b immediately after an applied shock.

FIG. 1c shows a partial view of micro-mechanical mirror arrangement 100 and the additional micro-mechanical mirror stop 104 of FIG. 1b immediately after an applied shock. As a result of the shock, an end 101a of the micro-mechanical mirror plate 101 may be positioned beneath the micro-mechanical mirror stop 104. Such a position of the end 101a may be undesirable or may result in potential damage the micro-mechanical mirror plate 101 and/or the micro-mechanical beam 103.

Figure 2A:
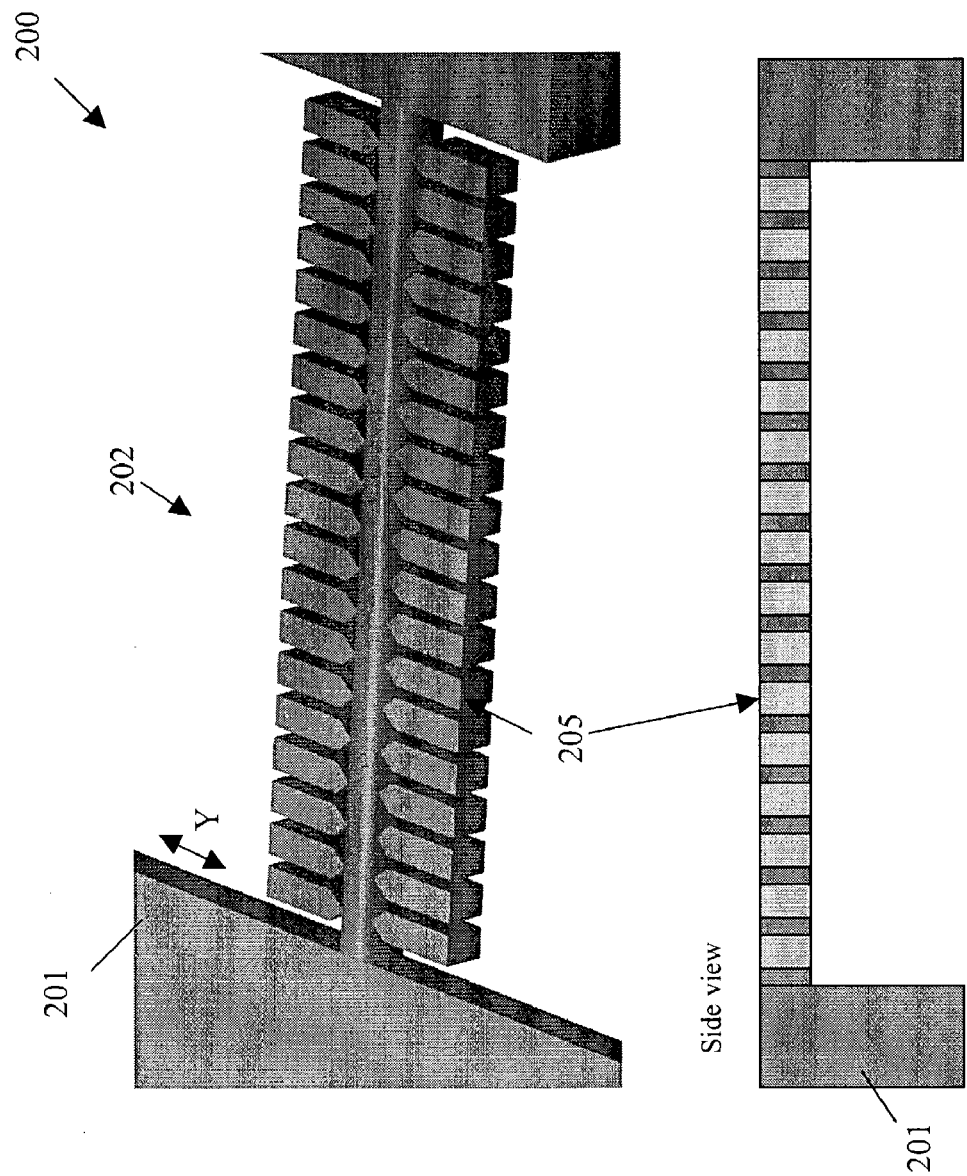
FIG. 2a shows a micro-mechanical beam arrangement to restrict an in-plane movement of a micro-mechanical mirror plate suspended by at least one micro-mechanical beam.

FIG. 2a shows a micro-mechanical beam arrangement 200 to restrict an in-plane movement of a micro-mechanical mirror plate 201 suspended by at least one micro-mechanical beam 202. The micro-mechanical beam arrangement 200 includes one or more micro-mechanical support structures 205 attached directly to the micro-mechanical beam 202 that limit the bending action of the micro-mechanical beam 202. Such support structures 205 may greatly increase the stiffness of the micro-mechanical beam 202 in a direction Y perpendicular to the axis of the micro-mechanical beam 202, with only marginal influence to the torsional stiffness.

Thus, for example, in case of a shock, the micro-mechanical mirror plate 201, whose mass may be relatively high in comparison with the micro-mechanical beam 202, may apply a force to the micro-mechanical beam 202 stressing it and causing it to bend resulting in an undesirable deflection of the micro-mechanical beam 202. With the attachment of the micro-mechanical support structures 205, the deflection of the micro-mechanical beam 202 may be limited as adjacent micro-mechanical support structures 205 touch each other and prevent further bending at points of the most severe deflection. Thus, the deflection caused by the applied shock may be spread more evenly. As a result, the micro-mechanical beam 202 may be able to absorb more energy and therefore withstand greater stresses. Thus, the addition of the micro-mechanical support structures 205 may enhance the maximal load and shock survival of the micro-mechanical beam 202, as well as that of the micro-mechanical mirror plate 201.

Figure 2B:
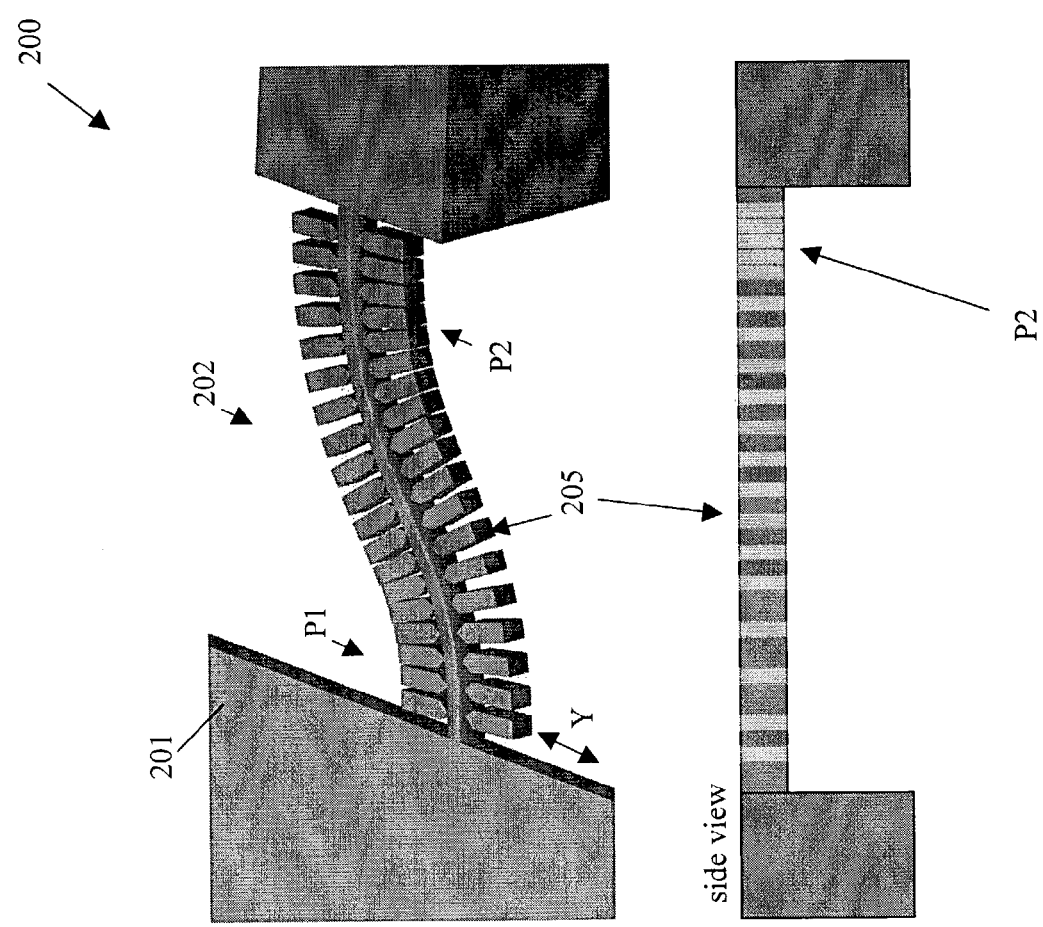
FIG. 2b shows the micro-mechanical beam arrangement of FIG. 2a in a deflective state under stress of an applied shock force, demonstrating how the micro-mechanical support structures may touch each other in case of a significant bending action and thereby limit the maximal bending action of the micro-mechanical beam.

FIG. 2b shows the micro-mechanical beam arrangement 200 of FIG. 2a in a deflective state under stress of an applied shock force, demonstrating how the micro-mechanical support structures 205 may touch each other in case of a significant bending action and thereby limit the maximal bending action of the micro-mechanical beam 202. In particular, if a deflection of the micro-mechanical beam 202 should occur, for example, in a direction Y that is in-plane with the micro-mechanical mirror plate 201 and perpendicular to the axis of the micro-mechanical beam 202, the micro-mechanical support structures 205 prevent further bending beyond a certain limit at points P1 and P2 along the axis of the micro-mechanical beam 202. Thus, the in-plane movement of the micro-mechanical mirror plate 201 may be limited and the required stress to break the micro-mechanical beam 202 may not be reached.

Figure 2C:
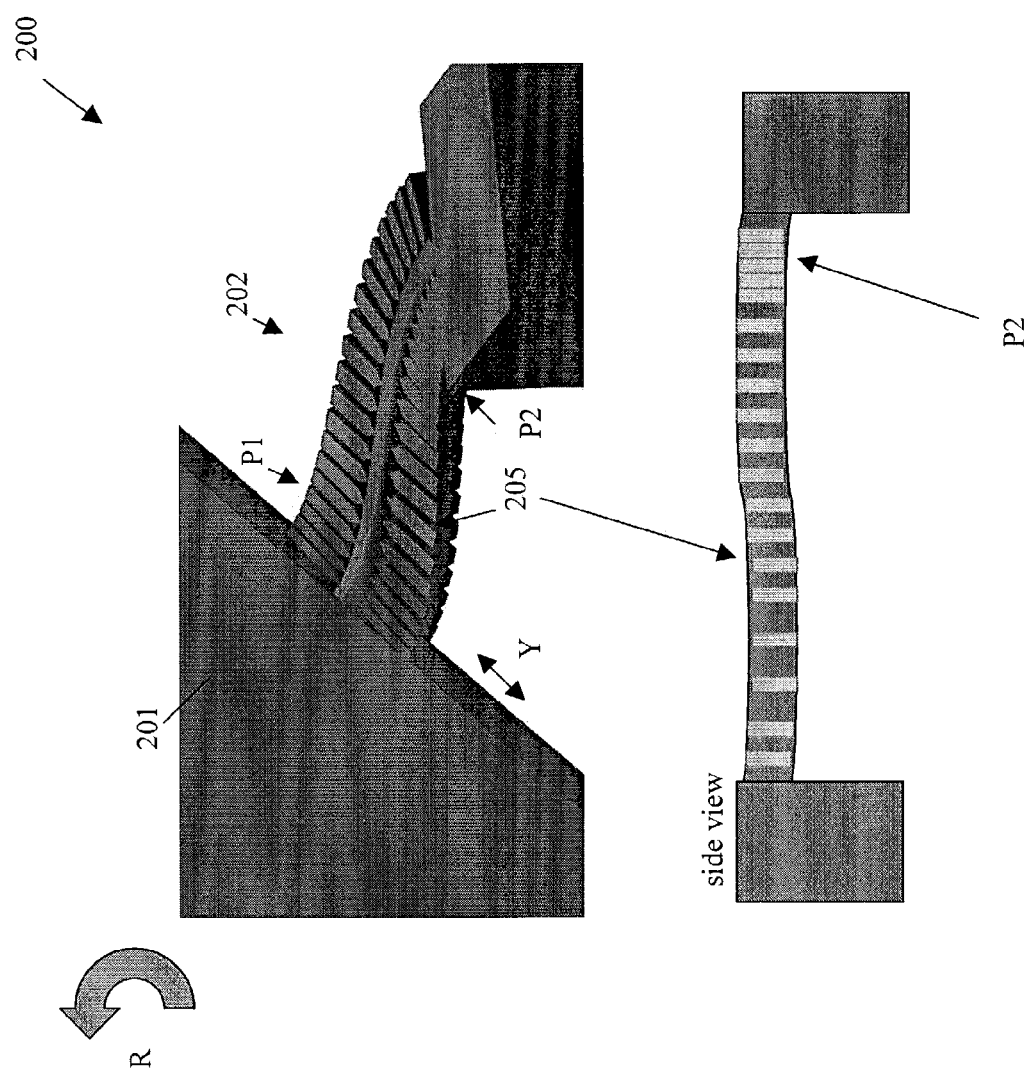
FIG. 2c shows the micro-mechanical beam arrangement of FIG. 2a under the stress of an applied shock force demonstrating how the micro-mechanical support structures may touch in case of a twisting action, and thereby still limit the maximal bending action of the micro-mechanical beam.

FIG. 2c shows the micro-mechanical beam arrangement 200 of FIG. 2a under the stress of an applied shock force demonstrating how the micro-mechanical support structures 205 may touch in case of a twisting action, and thereby still limit the maximal bending action of the micro-mechanical beam 202. In particular, should a deflection of the micro-mechanical beam 202 induce, for example, a movement of the micro-mechanical mirror plate 201 in a rotational direction R about the axis of the micro-mechanical beam 202, the micro-mechanical support structures 205 may still prevent bending beyond a certain limit at points P1 and P2 along the axis of the micro-mechanical beam 202. Thus, the in-plane movement of the micro-mechanical mirror plate 201 may still be limited and the required stress to break the micro-mechanical beam 202 may not be reached.

To achieve more precise control, the maximum bending action of the micro-mechanical beam 202 may be adjusted by adjusting the length of the micro-mechanical structures 205 and/or the gap between them. For instance, the stress and bending action of the micro-mechanical beam 202 may vary along its length. In particular, the highest stress may be found at the points of the highest bending, which may be found, for example, near points where the micro-mechanical beam 202 is attached to the micro-mechanical mirror plate 101. Since the bending action may vary depending on the position along the micro-mechanical beam, not every position along the micro-mechanical beam may require equal protection (for example, the bending action in the middle of a double clamped beam may be lower). Thus, by reducing and/or abandoning micro-mechanical support structures 205 at points of low bending, the damping action may be targeted and localized along the length of the micro-mechanical beam 202. Additionally, the length and thickness of the micro-mechanical support structures may be varied along the length to localize the damping action. Such localization of the damping action may permit a "tailoring" of the movement of the attached micro-mechanical mirror plate 201.

Figure 3A:
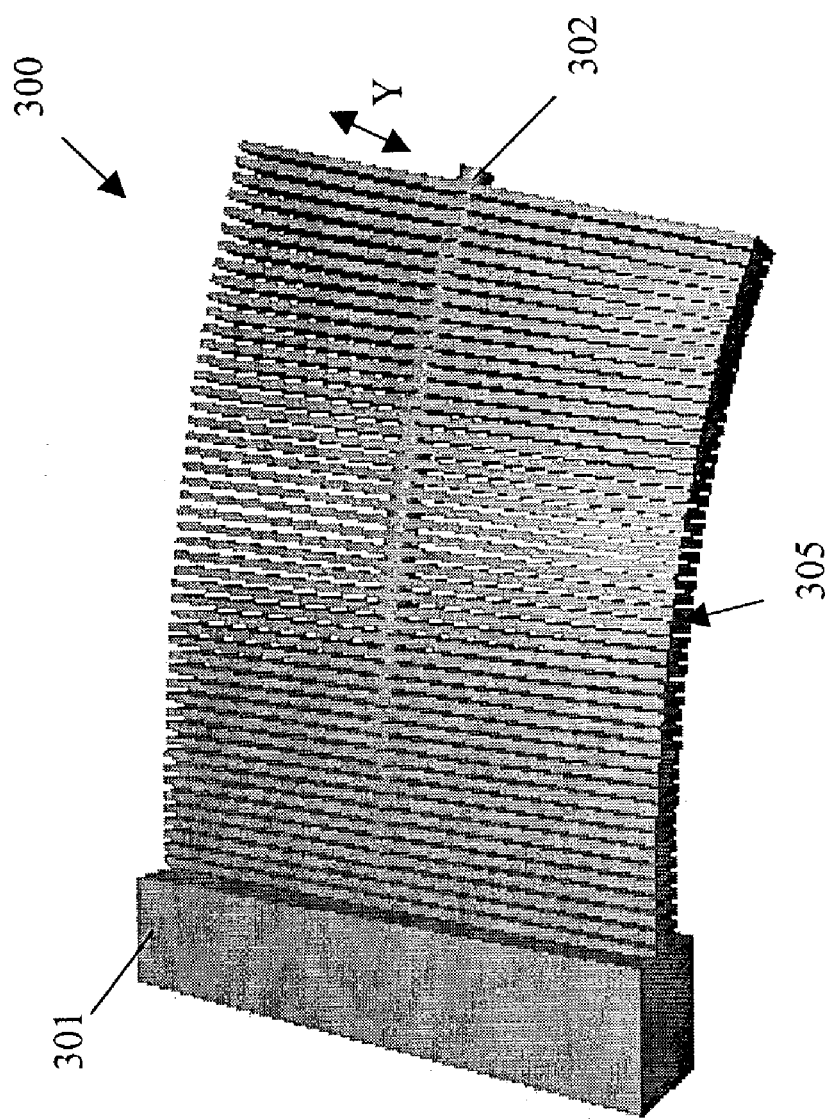
FIG. 3a shows an exemplary variation of the micro-mechanical support structures.
Figure 3B:
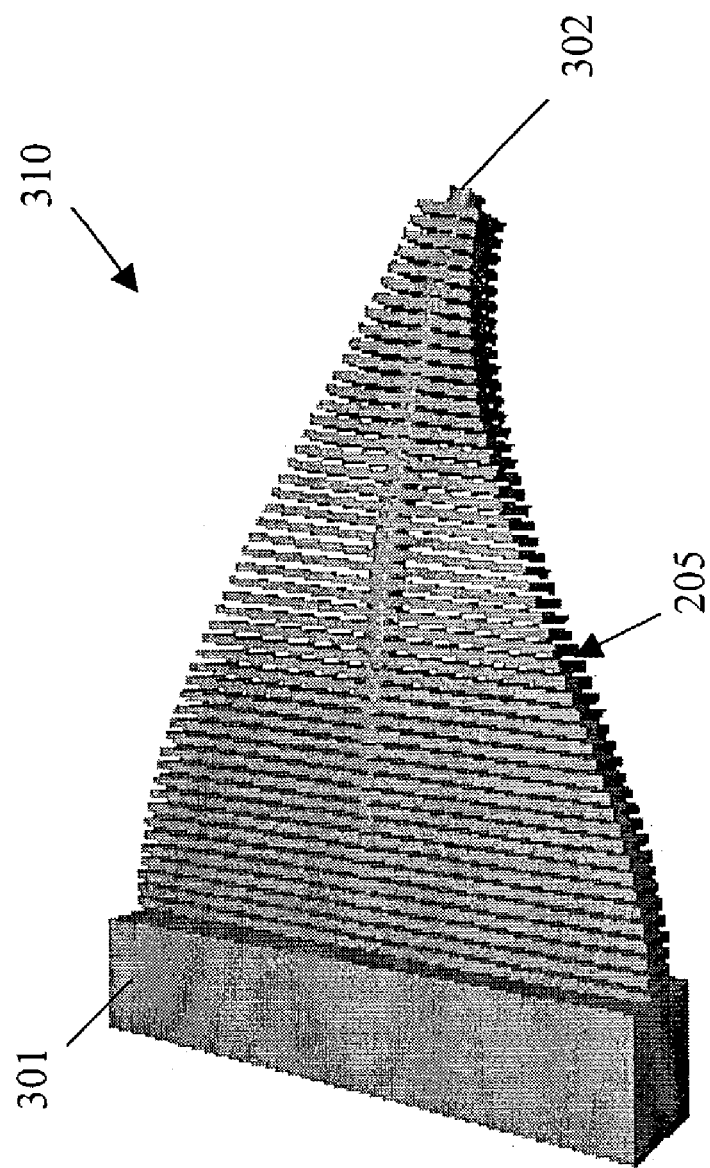
FIG. 3b shows an additional exemplary variation of the micro-mechanical support structures.
Figure 3C:
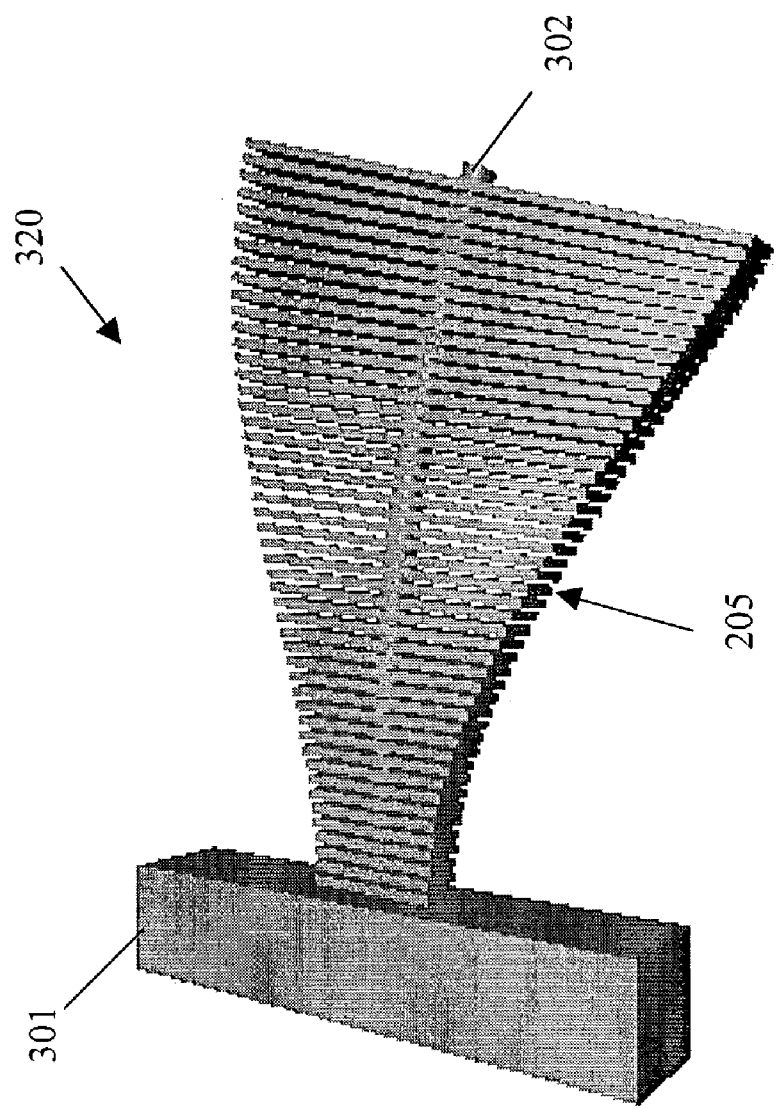
FIG. 3c shows a further additional exemplary variation of the micro-mechanical support structures.

FIGS. 3a, 3b, and 3c show exemplary variations of the micro-mechanical support structures 205. In FIG. 3a, the micro-mechanical support structures 305 are distributed uniformly with an even length along the axis of the micro-mechanical beam 302 thereby providing uniform protection along the axis of the micro-mechanical beam with to a horizontal in-plane bending action in direction Y. In FIG. 3b, the micro-mechanical support structures 305 are distributed with a decreasing length along the axis of the micro-mechanical beam 302, starting from the micro-mechanical mirror plate 301 and extending lengthwise. In FIG. 3c, the micro-mechanical support structures 305 are distributed with an increasing length along the axis of the micro-mechanical beam 302 starting from the micro-mechanical mirror plate 301 and extending lengthwise.

Figure 4:
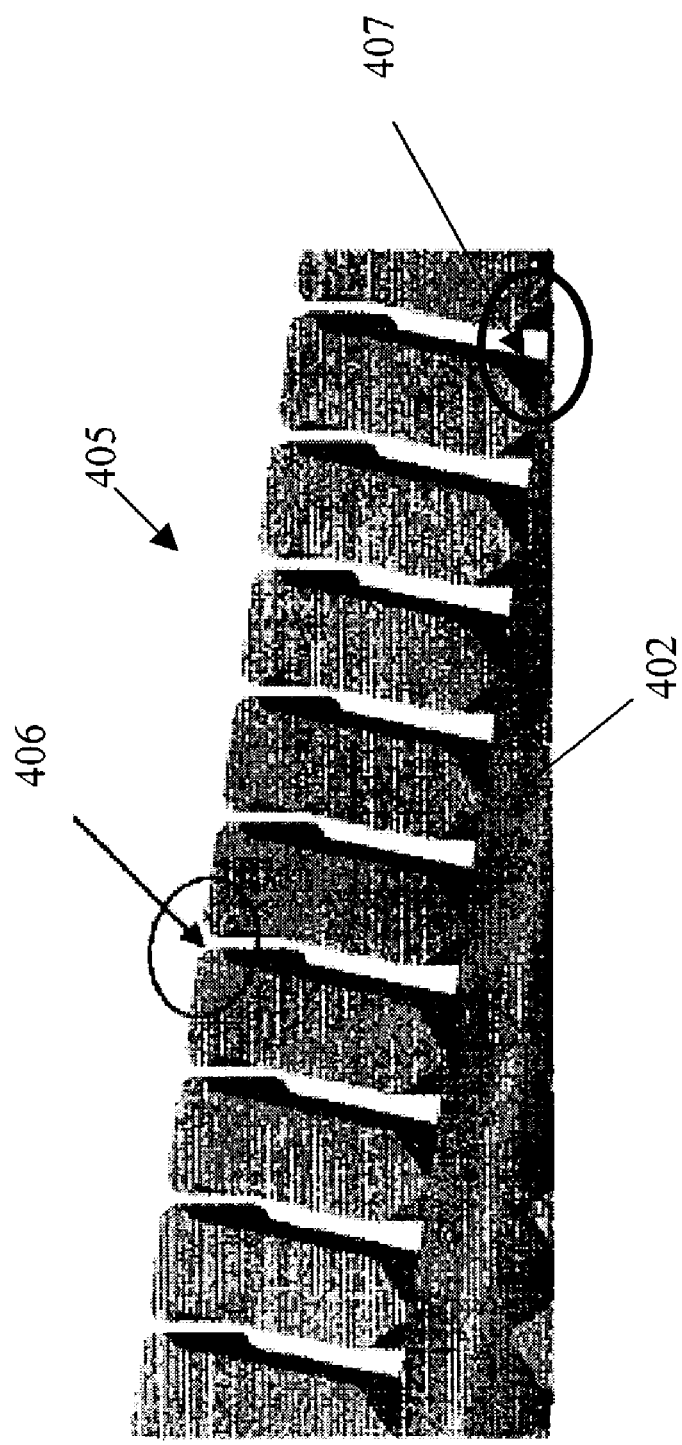
FIG. 4 shows an exemplary variation of the micro-mechanical support structures to reduce stiction.

FIG. 4 shows an exemplary variation of the micro-mechanical support structures 405 to reduce "stiction" (the tendency of surfaces of the support structures to "stick together" due to, for example, electrostatic effects). The addition of the micro-mechanical support structures 405 may influence the natural spring constant of the beam spring 402. To reduce such influences upon the natural spring constant, the micro-mechanical support structures 405 may be varied in shape and size. In particular, round contact areas 406 at points of contact between two micro-mechanical structures 405 and/or tapered ends 407 near their point of attachment with the beam spring may reduce effects such as stiction.

Although depicted in rectangular/parallelepiped form, the support structures 405 may be any suitably appropriate shape, including, for example, round, cubic, cylindrical, tubular, coil-shaped, quonset-shaped, prism-shaped, pyramid, obelisk, wedge, spherical, prolate spheroid, cone-shaped, catenoid, ellipsoid, paraboloid, conoid, disc-shaped, toroid, serpentine, helix, concave, and convex. Hence, with such a multitude of structure types, the support structures may provide protections in a variety of directions (e.g., X and Z directions) and/or all directions (i.e., "wrap around" protection—up to 360 degrees protection or part thereof).

What is claimed is:

1. An arrangement for use with a micro-mechanical beam, comprising:
   a protective structure including at least two support structures configured to directly attach to the micro-mechanical beam to increase bending stiffness of the micro-mechanical beam without significantly influencing torsional stiffness and without causing a flexing of the micro-mechanical beam;
   wherein the at least two support structures are arranged to touch each other upon reaching a predetermined bending action of the micro-mechanical beam and prevent a further bending action of the micro-mechanical beam; and
   wherein the at least two support structures include a tapered end near a point of attachment with the micro-mechanical beam.

2. The arrangement of claim 1, wherein the protective structure is positioned at a point of a maximum bending of the micro-mechanical beam.

3. The arrangement of claim 1, wherein the support structure is constructed to reduce stiction.

4. The arrangement of claim 1, wherein the support structure includes a rounded contact area.

5. The arrangement of claim 1, wherein the support structure is arranged at a point of maximum bending of the micro-mechanical beam and includes a rounded contact area and a tapered end near a point of attachment.

6. The arrangement of claim 1, wherein a shape of at least one of the support structures includes at least one of round, cubic, cylindrical, tubular, coil-shaped, quonset-shaped, prism-shaped, pyramid, obelisk, wedge, spherical, prolate spheroid, cone-shaped, catenoid, ellipsoid, paraboloid, conoid, disc-shaped, toroid, serpentine, helix, concave, and convex.

7. The arrangement of claim 1, wherein a first one and a second one of the at least two support structures are equal in at least one of length, size, and shape.

8. The arrangement of claim 1, wherein at least one of the support structures is configured to minimize electrostatic effects.

9. The arrangement of claim 1, wherein the protective structure is configured to increase bending stiffness of the micro-mechanical beam in a variety of directions.

10. A device for use with a micro-mechanical beam, comprising:
a protective structure to restrict a bending action of the micro-mechanical beam without causing a flexing of the micro-mechanical beam, and configured to directly attach to the micro-mechanical beam at specific points along the beam;
wherein the protective structure includes at least two adjacent support structures arranged to touch each other upon reaching a predetermined bending action of the micro-mechanical beam and prevent a further bending action of the micro-mechanical beam; and
wherein the at least two adjacent support structures include a tapered end near a point of attachment with the micro-mechanical beam.

11. The device of claim 10, wherein the at least two adjacent support structures are positioned at points of most severe deflection of the micro-mechanical beam.

12. The device of claim 10, wherein the protective structures are distributed uniformly with an even length along an axis of the micro-mechanical beam.

13. The device of claim 10, wherein the protective structure restricts the bending action in at least one of a variety of directions and all directions.

14. An arrangement for use with a micro-mechanical mirror, comprising:

a micro-mechanical beam attached to the micro-mechanical mirror; and
at least two support structures attached to the micro-mechanical beam to restrict a bending action of the micro-mechanical beam without causing a flexing of the micro-mechanical beam;
wherein the at least two adjacent support structures are arranged to touch each other upon reaching a predetermined bending action of the micro-mechanical beam and prevent a further bending action of the micro-mechanical; and
wherein the at least two adjacent support structures include a tapered end near a point of attachment with the micro-mechanical beam.

15. An arrangement comprising:
a micro-mechanical mirror plate;
a micro-mechanical beam attached to the micro-mechanical mirror plate; and
at least two support structures to restrict a bending action of the micro-mechanical mirror beam without causing a flexing of the micro-mechanical beam;
wherein the at least two adjacent support structures are arranged to touch each other upon reaching a predetermined bending action of the micro-mechanical beam and prevent a further bending action of the micro-mechanical beam; and
wherein the at least two support structures include a tapered end near a point of attachment with the micro-mechanical beam.

16. An arrangement to protect a micro-mechanical mirror plate, comprising:
at least two support structures configured to restrict an in-plane movement of the micro-mechanical mirror plate without causing a flexing of the micro-mechanical beam, and being directly attachable to a micro-mechanical beam that suspends the micro-mechanical mirror plate;
wherein the at least two adjacent support structures are arranged to touch each other upon reaching a predetermined bending action of the micro-mechanical beam and prevent a further bending action of the micro-mechanical beam; and
wherein the at least two support structures include a tapered end near a point of attachment with the micro-mechanical beam.

* * * * *